United States Patent [19]

Henzler

[11] Patent Number: 4,727,250

[45] Date of Patent: Feb. 23, 1988

[54] APPARATUS FOR MEASURING THE ANGULAR DISTRIBUTION OF CHARGED PARTICLES SCATTERED BY A SAMPLE SURFACE

[75] Inventor: Martin Henzler, Garbsen, Fed. Rep. of Germany

[73] Assignee: Leybold-Heraeus GmbH, Cologne, Fed. Rep. of Germany

[21] Appl. No.: 7,617

[22] Filed: Jan. 28, 1987

Related U.S. Application Data

[63] Continuation of Ser. No. 699,011, Feb. 7, 1985, abandoned.

[30] Foreign Application Priority Data

Feb. 18, 1984 [EP] European Pat. Off. ........ 84101690.0

[51] Int. Cl.⁴ ............................................. H01J 37/26
[52] U.S. Cl. ................................. 250/305; 250/306; 250/396 R
[58] Field of Search ........... 250/305, 306, 310, 396 R, 250/397, 398, 399

[56] References Cited

U.S. PATENT DOCUMENTS

| | | | |
|---|---|---|---|
| 2,939,954 | 6/1960 | Ong | 250/310 |
| 3,474,245 | 10/1969 | Kimura et al. | 250/397 |
| 3,657,593 | 4/1972 | Garrood et al. | 315/18 |
| 3,845,305 | 10/1974 | Liebl | 250/309 |
| 4,551,599 | 11/1985 | Liebl | 250/396 R |
| 4,639,602 | 1/1960 | Henzler | 250/396 R |

FOREIGN PATENT DOCUMENTS 0506084 4/1976 U.S.S.R. ............................... 250/397

OTHER PUBLICATIONS

Soma, "A Practical Focus-Deflection System for Shaped Electron Beams," Optik., vol. 53, 4, pp. 281-284.

Berger et al., "Preliminary Study for the Construction of the Low Energy Electron Diffraction Apparatus Using a High Tension Source," J. App. Phys., Dec. 77. Surface Science, vol. 117 (1982), pp. 180-187.

Proc. Eur. Cong. on Electron Microscopy, 1972, "Combined Ultra High Vacuum Electron and Low Energy Diffraction Microscopy."

Primary Examiner—Bruce C. Anderson
Assistant Examiner—Paul A. Guss
Attorney, Agent, or Firm—Felfe & Lynch

[57] ABSTRACT

Apparatus for measuring the angular distribution of charged particles scattered by a sample surface, having a source for the production of a primary particle beam and a deflection system for the deflection of the scattered particles onto the entry orifice of a detector connected to the deflection system, useful, for example, for the study of crystal surfaces by the so-called LEED technique. On the side of the deflection system opposite the sample not only a detector but also a particle source is disposed such that the primary beam also passes through the deflection system. The scannable range of the apparatus for determining the angular distribution of scattered electrons resulting from diffraction is considerably greater than that of the prior art.

6 Claims, 6 Drawing Figures

APPARATUS FOR MEASURING THE ANGULAR DISTRIBUTION OF CHARGED PARTICLES SCATTERED BY A SAMPLE SURFACE

This is a continuation application of application Ser. No. 699,011, filed Feb. 7, 1985, now abandoned.

This invention relates to apparatus for measuring the angular distribution of charged particles scattered by a sample surface, having a source for the production of a primary particle beam and a deflection system for the deflection of the scattered particles onto the entry orifice of a detector connected to the deflection system.

Apparatus of this kind serves, for example, for the study of crystal surfaces by the so-called LEED (low energy electron diffraction) technique. In this process the crystal surface is bombarded with low-energy electrons (20 to 500 eV). On the structures of the crystal surface diffraction phenomena are produced which result in scattering in preferred directions. The determination of these preferred directions can be accomplished by measuring the angular distribution of the scattered electrons. Another method consists in making the scattered electrons visible by means of a phosphor screen. If the crystal surface is regular, regular diffraction images are formed, which are composed of individual diffraction reflexes. In the case of departures from regularity, defects of the surface structure are indicated.

An apparatus of the kind described above is disclosed in *Surface Science*, 117 (1982), 180-187. The arrangement of the individual components is such that the angle between the incident particle beam and an elastically scattered beam amounts to 90°. For particle beams which, due to interaction with the surface of the sample, undergo a diffraction, the emergence angle differs from 90°. The deflection system placed in front of the detector has the purpose of selectively deflecting these particle beams which deviate from the direction of an elastically scattered beam such that they will strike the entrance orifice of the detector. For this purpose a very uniform electrical field is produced in the deflection system, with a variable field strength and direction. The angular distribution is determined by scanning. The magnitude of the scanning range depends on the one hand on the size of the electrical field of uniform distribution prevailing in the deflection system, and on the other hand on the distance between the sample and the deflection system.

The present invention is addressed to the problem of creating a system of the kind described above which will have a considerably greater scanning range.

This problem is solved in accordance with the invention in that, on the side of the deflection system opposite from the sample not only the detector but also the particle source is disposed such that the primary beam also passes through the deflection system. By this measure both the incident beam and the diffracted beam are affected by the deflection system, and hence the scannable range of the diffraction image at a given maximum angle can be more than doubled. This advantage is achieved without additional constructional expense. Moreover, apparatus of the invention can be made more compact in comparison with the state of the art.

In accordance with the invention, apparatus for the measurement of the angular distribution of charged particles scattered at a sample surface, having a source for the production of a primary particle beam and a deflection system for the deflection of the scattered particles onto the entrance orifice of a detector connected to the deflection system, comprises on the side of the deflection system opposite the sample not only a detector but also a particle source disposed such that the primary beam also passes through the deflection system.

For a better understanding of the present invention, together with other and further objects thereof, reference is made to the following description, taken in connection with the accompanying drawings, and its scope will be pointed out in the appended claims.

Referring now to the drawings.

Figure 1:
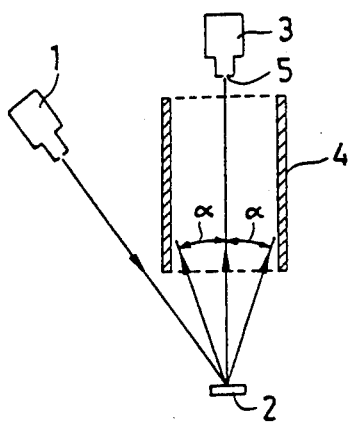
FIG. 1 is a diagrammatic view, partly in section, of apparatus constructed in accordance with the prior art.
Figure 4:
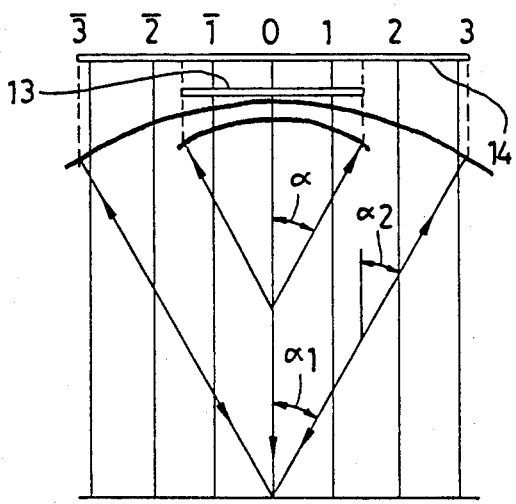
Figure 3:
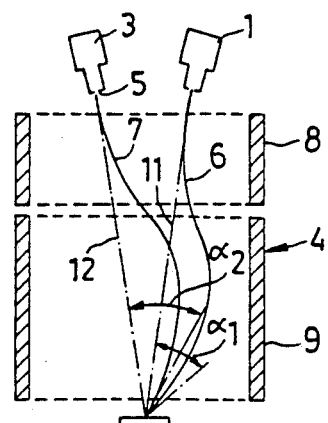
FIG. 3 is a diagrammatic view, partly in section, of another embodiment of apparatus constructed in accordance with the invention.
Figure 5:
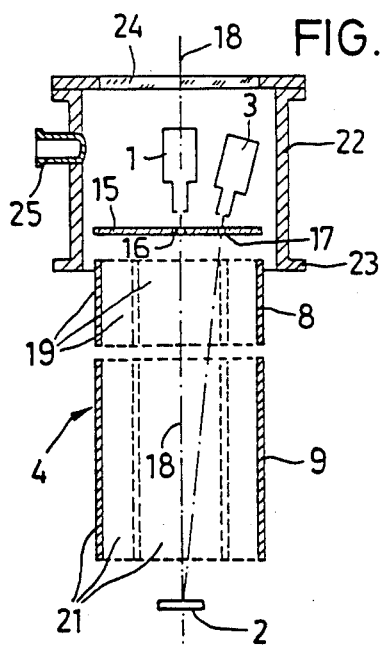
Figure 6:
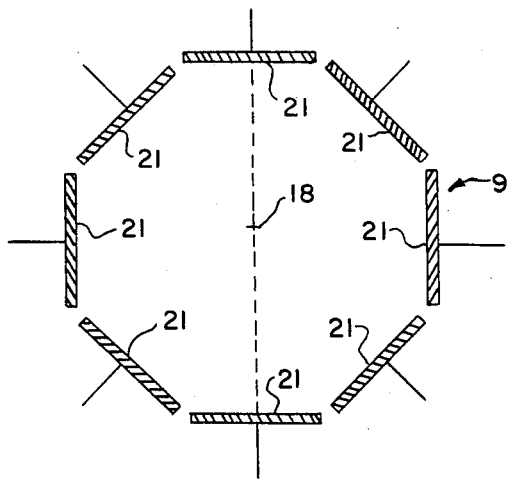

FIG. 4 is a diagram representing the useful range of the diffraction image for the FIG. 3 apparatus constructed in accordance with the invention as compared with the FIG. 1 apparatus of the prior art; and FIG. 5 is a diagrammatic view, partly in section, of an embodiment of the invention including a housing with a phosphor screen therein; and FIG. 6 is a diagrammatic end view of the deflection system of the FIG. 5 embodiment.

Referring now more particularly to the drawings, FIG. 1 shows an apparatus in accordance with the state of the art. It includes the particle source 1 by which charged particles are aimed at the sample 2. When the LEED technique is used, the particles are electrons with a relatively low energy. At the surface of the sample 2, the electrons undergo a diffraction and are scattered with preferred angles $\alpha$ in the direction of the detector 3. In front of the detector is a deflection system 4. This deflection system 4 has the purpose of imaging the particle beams coming from the sample 2 selectively onto the entrance orifice 5 of the detector 3. This makes it possible to measure the angular distribution of the particles or electrons scattered by the sample 2 without the need for a mechanical movement of the crystal 2 or of the detector 3 translation. The system is usable not only for the LEED technique but also for photoemissivity measurements in which the angle-related emission provides important information, e.g., on the band structure of crystals.

Figure 2:
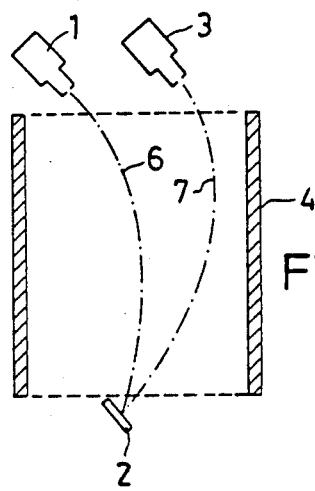
FIG. 2 is a diagrammatic view, partly in section, of apparatus constructed in accordance with the invention.

Referring now more particularly to FIG. 2, the numerals 1 and 3 again identify the particle source and the detector. The arrangement of these elements with respect to the deflection system is such that both the primary beam 6 and the scattered particle beams 7 pass through the deflection system. As a result of the electrical field produced by the deflection system 4, both the primary beam 6 and the secondary beam 7 undergo deflection. It is therefore desirable to align the source 1, detector 3 and sample 2 accordingly.

In the embodiment represented in FIG. 3, the deflection system 4 is divided. It comprises the sections 8 and 9 with approximately inverse voltage inputs. The voltages are selected such that the primary beam 6 is deflected first from the imaginary straight line 11 between the particle source 1 and the sample 2. In the second section 9 it undergoes an opposite deflection, so that the primary beam 6 strikes the sample 2 at the angle $\alpha_1$ (with respect to the straight line 11).

The particle path 7 is an example of one of the different particle beams which are scattered with a preferred direction at the sample surface. The particle beam 7 leaves the sample 2 at the angle $\alpha_2$ from the straight line 12 between the sample 2 and the entrance orifice 5 of the detector 3, and is deflected in section 9 of the deflection system 4 back toward this straight line. In section 8, the direction of deflection changes such that the secondary beam 7 preferably impinges perpendicularly upon the entrance orifice 5 of the detector 3. The particle source 1 and detector 3 preferably are, in this apparatus, approximately equidistant from the axis of the deflection system.

FIG. 4, with the aid of a representation of the useful range of the diffraction image (reciprocal space), shows the advance achieved by an embodiment of apparatus constructed in accordance with the invention, namely by the apparatus represented in FIG. 3, over the state of the art represented in FIG. 1. Illustrated are the angles $\alpha$ (from FIG. 1) and the angles $\alpha_1$ and $\alpha_2$ (from FIG. 3). The vertical lines indicate the order of diffraction. This figure shows the useful ranges in the state of the art (line 13) and in the embodiment shown in FIG. 3 (line 14). It can be seen that the scannable range 14 achieved by the FIG. 3 apparatus, both of the incident beam and of the diffracted beam, is more than twice as large as the scannable range 13 of the state of the art.

Lastly, FIG. 5 shows apparatus in which a phosphor screen 15 is disposed between the deflection system 4 and the particle source 1. This phosphor screen has openings 16 and 17 for the particle beams. the deflection system 4 again comprise two sections 8 and 9 which in turn comprise eight plates each, disposed rotationally symmetrically (tangentially with respect to an imaginary circle) about the axis 18 of the system. If the angular distribution of the particles scattered on the surface of the sample 2 is to be measured by means of the detector 1, the voltages on sections 8 and 9 are selected in the manner described in conjunction with FIG. 3. If the diffractions are to be made visible by means of the phosphor screen 15, then all deflection plates 19 and 21 are placed at ground potential.

The individual components 1, 3, 15, 19 and 21 preferably are mounted in a manner not indicated on a housing 22 which is equipped with a flange 23 and is thus able to be placed on a receptacle in which the sample 2 is located. At the end opposite from the flange 23, a window 24 preferably forms the closure of the housing 22, so that the phosphor screen 15 remains visible. The particle source 1 preferably is disposed on the axis 18 of the system, the detector 3 laterally thereof. Thus, only a small portion of the phosphor screen 15 is covered. By the rotation of the deflection field in the deflection system 4, the diffraction images, which at first are concealed by the components 1 and 3, are made visible. The housing 22 can be connected to a vacuum pump through a connection 25.

While there has been described what is at present considered to be the preferred embodiment of this invention, it will be obvious to those skilled in the art that various changes and modifications may be made therein without departing from the invention, and it is, therefore, aimed to cover all such changes and modifications as fall within the true spirit and scope of the invention.

I claim:

1. Apparatus for the measurement of the angular distribution of low energy electrons scattered at a sample surface, wherein the scattered electrons have the same energy as the electrons of a primary beam comprising electron source means for the production of a primary low energy electron beam and electrostatic deflection means for deflecting both said primary beam and said scattered electrons for enabling measurement of the angular distribution of said scattered electrons; wherein said deflection means deflects said scattered electrons leaving the sample at a preselected exit angle onto an entrance orifice of a detector responsive to the deflection means; and further comprising on the side of said deflection means opposite the sample not only said detector but also said electron source means disposed side by side such that the primary electron beam also passes through said deflection means, and wherein said electrostatic deflection means is divided in its longitudinal direction into two sections and each section comprises rotationally symmetrically disposed electrostatic deflection plates.

2. Apparatus in accordance with claim 1, in which said deflection means comprises eight rotationally symmetrically disposed deflection plates.

3. Apparatus in accordance with claim 1, in which the positions of said detector and said election source are approximately at the same distance from the axis of said deflection means.

4. Apparatus in accordance with claim 1, in which said electron source or said detector is disposed on the axis of said deflection means.

5. Apparatus in accordance with claim 1, which includes, between said deflection means and said electron source on the one hand and between said deflection means and said detector on the other, a phosphor screen equipped with passage openings.

6. Apparatus in accordance with claim 5, which includes a housing for mounting said electron source, said detector, said deflection means and said phosphor screen, said housing having a vacuum-tight window for viewing the phosphor screen.

* * * * *